United States Patent [19]

Ehrenhalt et al.

[11] Patent Number: 4,841,258
[45] Date of Patent: Jun. 20, 1989

[54] METHOD FOR PACKAGING A MICROWAVE TUBE MODULATOR

[75] Inventors: Dan Ehrenhalt, Buffalo; George R. Giles, Getzville, both of N.Y.

[73] Assignee: LTV Aerospace & Defense Co., Dallas, Tex.

[21] Appl. No.: 156,175

[22] Filed: Feb. 16, 1988

[51] Int. Cl.$^4$ .............................................. H03K 7/00
[52] U.S. Cl. ..................................................... 332/9 R
[58] Field of Search ................................. 332/9 R, 9 T

[56] References Cited
U.S. PATENT DOCUMENTS
4,577,166  3/1986  Milberger et al. ................... 332/9 R

*Primary Examiner*—David Mis
*Attorney, Agent, or Firm*—Brooks & Kushman

[57] ABSTRACT

A method for packaging components in the primary circuit of a microwave tube modulator output transformer. Modules are assembled using parallel plates upon and around which transistors and other necessary components are mounted. In addition to providing mechanical support for the components, the plates act as conductors for circuits common to respective elements of paralleled transistors, thereby minimizing electrical resistance and inductance in the primary circuit. The modules are designed to mount to the output transformer such that two of the parallel plates are mechanically connected to the respective two ends of the transformer primary, and a number of modules can be mounted around and to one transformer according to the amount of energy required.

38 Claims, 4 Drawing Sheets

METHOD FOR PACKAGING A MICROWAVE TUBE MODULATOR

TECHNICAL BACKGROUND

This invention relates to the packaging of modulators used to provide high-voltage pulses to microwave transmitter tube output transformers.

BACKGROUND ART

A number of devices have been designed to provide pulses for use in microwave modulation applications. Some of these use field-effect transistors (FET's) connected in parallel to provide the necessary energy to drive a microwave tube modulator output transformer, but such configurations do not minimize electrical resistance and inductance in the primary circuits of the associated output transformers and require modifications to increment their energy-providing capacities. See, for example, U.S. Pat. Nos. 3,374,406; 3,374,407; 3,426,255; 3,509,567; 3,525,861; 3,544,399; 3,562,672; 3,582,975; 3,828,324; 3,914,555; 3,967,217; 3,995,178; 4,010,450; 4,071,777; 4,095,251; 4,143,387; 4,221,044; 4,235,010; 4,247,903; 4,262,296; 4,304,042; 4,328,470; 4,409,594; 4,425,527; 4,662,058; 4,679,050; 4,679,299; 4,683,387; and 4,689,802.

The present invention provides a modulator comprising elements in a combination and configuration that simultaneously minimizes the electrical resistance and inductance in the primary circuit of its associated microwave tube modulator output transformer and facilitates the combining of modulator units to supply incrementally increased amounts of energy to the output transformer.

DISCLOSURE OF THE INVENTION

In accordance with the present invention, a modulator is provided that is capable of supplying high-voltage pulses having short rise and fall times to the primary windings of appropriately selected transformers connected to a large number of different microwave transmitter tubes such as magnetrons, pulse cavity oscillators, cross field amplifiers and traveling wave tubes.

The preferred embodiment of the present invention contemplates a modulator having a plurality of plates used to mount components such as transistors and transformers such that the critical distances between the components are minimized, thereby contributing to the minimization of electrical resistance and inductance in associated circuitry.

The invention further contemplates a modulator having a plurality of plates used to mount components such that the plates act as electrical conductors between common elements of the components to additionally contribute to the minimization of electrical resistance and inductance in associated circuitry.

The invention also contemplates a modulator having a configuration enabling it to be combined with like modulators to provide incrementally greater amounts of energy.

The invention additionally contemplates a modulator that can, by combining an appropriate number of modulator units and using appropriate output transformers, be matched to a large number of microwave transmitter tubes.

The invention further contemplates a modulator that is relatively small.

The invention also contemplates a modulator that is relatively easy to produce and maintain.

BRIEF DESCRIPTION OF THE DRAWINGS

In the drawings, in which like reference characters indicate corresponding parts in all the figures.

DETAILED DESCRIPTION OF THE PREFERRED EMBODIMENT OF THE INVENTION

Essentially, the microwave tube modulator is assembled on and between three main plates and two smaller plates. The plates serve as mounts for the components and also as low-resistance electrical conductors between common elements thereof. The plates and components are arranged to minimize the distances between the components in the primary circuit of an associated output transformer, thereby minimizing electrical resistance and inductance, and also to facilitate the combining of a number of modulator units to provide incrementally increased energy to drive one output transformer.

Figure 1:
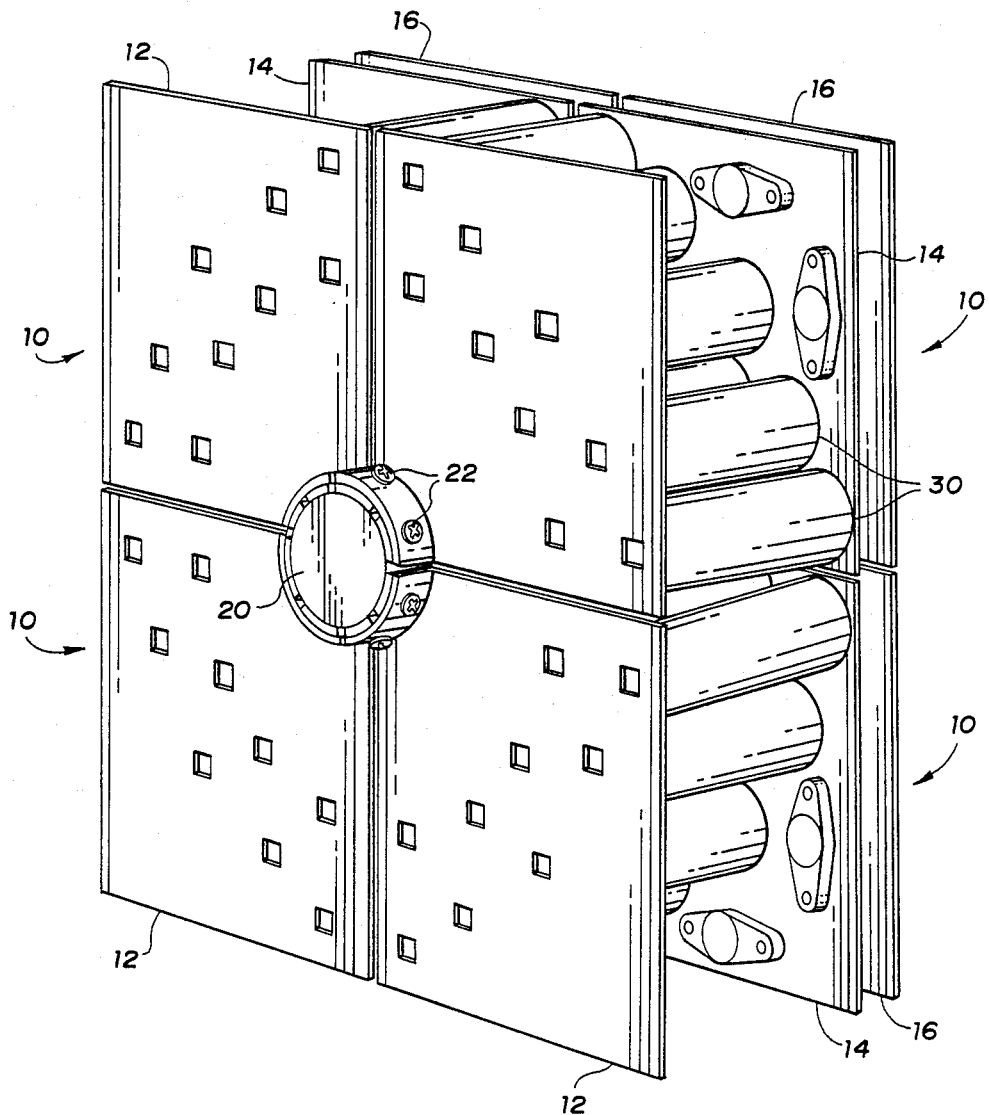
FIG. 1 is a perspective view of four microwave tube modulator units connected to a microwave tube output transformer and embodying features of the invention.

With reference to FIG. 1, shown is a perspective view of four microwave tube modulator units, generally indicated by reference characters 10. Each modulator unit 10 has a first plate 12, a second plate 14 in spaced apposition thereto, and a third plate 16 in progressively spaced apposition to the first plate 12 and the second plate 14. The plates 12, 14, and 16 are electrically isolated from each other.

Figure 2:
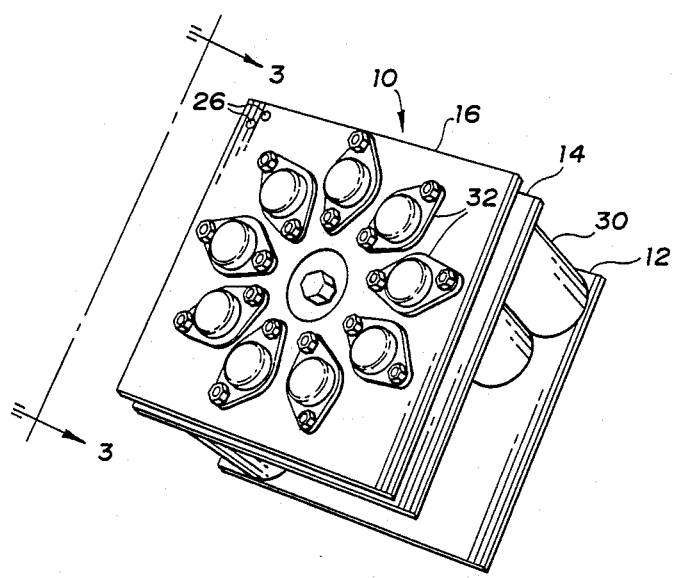
FIG. 2 is a perspective view showing the opposite side of one of the units of FIG. 1
Figure 3:
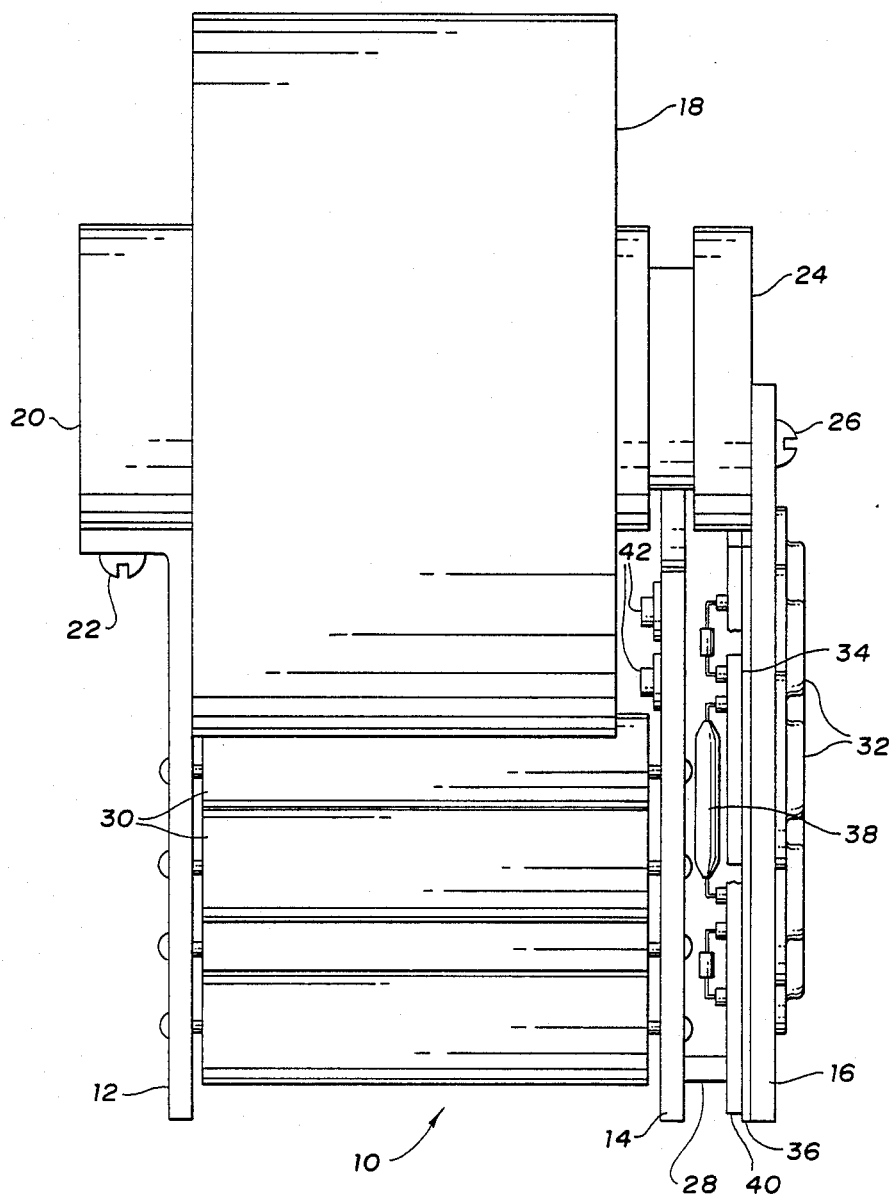
FIG. 3 is a side view, partly broken away, taken along the line 3—3 of FIG. 2.

FIG. 2 is a perspective view from the opposite direction of one of the modulator units 10, and FIG. 3 is a side view taken along the line 3—3 of FIG. 2. An associated output transformer 18 is shown in FIG. 3. The first plate 12 is secured to the first end 20 of the primary of the transformer 18 with screws 22, and the third plate 16 is secured to the second end 24 of the primary of the transformer 18 with screws 26. The second plate 14 is secured to the third plate 16 by posts 28 but is electrically isolated from the second plate 14 and the second end 24 of the transformer primary. Connected to and extending between the first plate 12 and the second plate 14 are a number of primary current storage capacitors 30. The first and second plates 12 and 14 serve as mounts for the capacitors 30 and also as low-resistance electrical conductors therefor, the first plate 12 being connected to a source of positive voltage and the second plate 14 being connected to ground.

Mounted on the third plate 16 are a plurality of power transistors 32, which may be field-effect-transistors (FET's). The transistors 32 are connected in parallel, and the drain element of each is connected to the third plate 16. The transistors 32 are connected in a common gate configuration to minimize the effects of drain-to-gate capacitance and thereby increase the transistor switching speed. The plate 16 serves both as a mount for the transistors 32 and as a low-resistance electrical conductor between the drain elements of the transistors 32 and the second end 24 of the primary of the output transformer 18. As can be seen in FIG. 2, the transistors 32 are arranged in close mutual proximity to minimize the distances between connections to their respective elements.

Mounted to the second plate 14 are a plurality of driver transistors 42, which may be field-effect-transistors. The driver transistors 42 are connected in parallel, and the source element of each is connected through fuse resistors (not shown) to the second plate 14. The plate 14 serves both as a mount for the transistors 42 and as a low-resistance electrical conductor between the source element fuse resistors and ground. The drain elements of the driver transistors 42 are connected to a first end of the primary winding of a coupling transformer 38 mounted centrally to the second plate 14. The second end of the primary winding of the coupling transformer 38 is connected to a source of positive voltage. The gate elements of the driver transistors 42 are connected through resistors to a first end of a feedback winding of the coupling transformer 38, and the second end of the feedback winding is connected to ground. The driver transistors 42 and associated resistors form a driver circuit that amplifies incoming signals before they are introduced to the primary circuit of the output transformer 18 through the coupling transformer 38.

Figure 4:
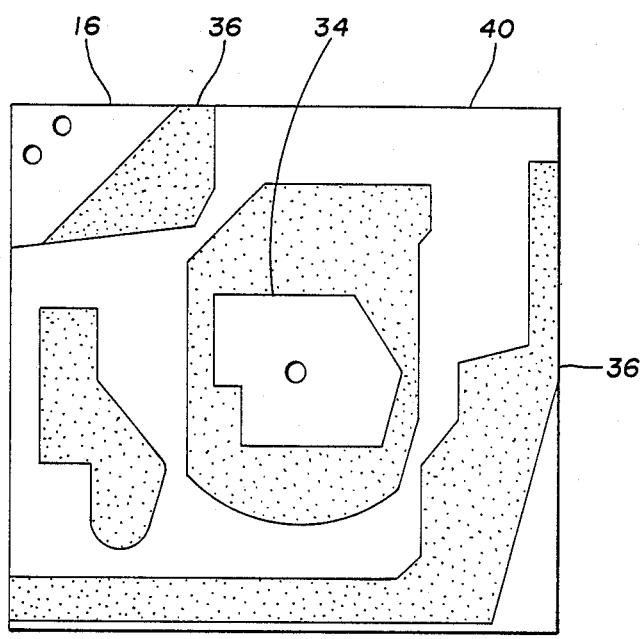
FIG. 4 is a rear view of one of the plates of the modulator.

FIG. 4 is a view of the surface of the third plate 16 that faces the second plate 14. As shown in FIGS. 3 and 4, a fourth plate 34 is mounted proximate the third plate 16 but is electrically isolated and separated therefrom by an insulator 36. The fourth plate 34 is connected through fuse resistors (shown only representatively in FIG. 3) to the source element of each transistor 32 and serves as a low-resistance conductor between the source fuse resistors and one end of the output winding of a transformer 38 coupling a driver amplifier to the primary circuit of the modulator 10.

A fifth plate 40 is mounted proximate the third plate 16 but is also electrically isolated and separated therefrom by insulator 36. The fifth plate 40 is connected through parasitic-oscillation-limiting resistors (shown only representatively in FIG. 3) to the gate element of each transistor 32 and serves as a low-resistance conductor between the gate resistors and ground.

In the embodiment of the invention shown in FIGS. 1 and 3, up to four modulator units 10 may be secured to one output transformer 18 to provide four incremental levels of electrical energy. The first plate 12 of each modulator 10 may be secured to the first end 20 of the primary of the transformer 18, using screws 22, and the third plate 16 of each modulator 10 may be secured to the second end 24 of the primary of the transformer 18, using screws 26. Such a configuration brings the components in the primary circuit of the transformer 18 into close proximity with each other and with the contacting ends 20 and 24 of the primary of the output transformer 18, thus keeping the current paths short and the attending resistance and inductance at a minimum.

It should be understood that, depending on the application and other engineering considerations and requirements, the specific assignment and disposition of the plates and certain other components may vary. For example, to reduce the possibility of injury from electric shock in applications where there is a likelihood that personnel may have to work in the proximity of an exposed modulator assembly, the plates may be arranged so that the innermost plate is the one connected to a voltage source and the outermost plate is grounded. Similar changes and modifications may be made to accommodate requirements of cooling, space, and the like without departing from the spirit and scope of the invention.

What is claimed is:

1. A method for packaging into an effective module components, particularly power transistors, in the primary circuit of a microwave tube modulator output transformer to minimize electrical resistance and inductance in the primary circuit, the process comprising the steps of:

connecting a first plate to a first end of the microwave tube modulator output transformer primary, and connecting said first plate to a source of positive voltage;

mounting a second plate in spaced apposition to said first plate, and connecting said second plate to ground;

mounting a third plate in progressively spaced apposition to said first plate and said second plate, and connecting said third plate to a second end of the output transformer primary; and mounting a plurality of primary circuit power transistors on said third plate at minimum practical distances from the second end of the output transformer primary such that the common element of each of said power transistors is connected to said third plate and therefore effectively connected to the second end of the output transformer primary, said first plate providing a low-resistance path for current flowing between the output transformer primary and the source of positive voltage and said third plate providing a low-resistance path for current flowing between the respective drain elements of said power transistors and the output transformer primary, said first and said third plates also minimizing inductance in the output transformer primary circuit.

2. A method according to claim 1 further comprising the step of connecting said power transistors in parallel.

3. A method according to claim 2 wherein said power transistors are field-effect transistors.

4. A method according to claim 3 further comprising the step of connecting said power transistors in a common gate configuration to minimize the effects of drain-to-gate capacitance and thereby increase the switching speed of said transistors, the gate element of each of said power transistors being connected to said third plate and therefore effectively connected to the second end of the output transformer primary.

5. A method according to claim further comprising the step of mounting to said second plate a coupling transformer having a primary, a feedback and a secondary winding, said feedback winding having a common end and an output end, the common end being connected to ground, said secondary winding having a common end and an output end, the common end being connected to ground.

6. A method according to claim 5 wherein said coupling transformer is mounted central to said second plate and between said second plate and said third plate.

7. A method according to claim 1 further comprising the step of mounting a fourth plate in spaced apposition to and electrically isolated from said third plate, and connecting said fourth plate through respective fuse resistors to the source element of each of said power transistors.

8. A method according to claim 7 further comprising the step of connecting said fourth plate to the output end of the secondary winding of said coupling transformer.

9. A method according to claim 8 further comprising the step of mounting a fifth plate in spaced apposition to said third plate and electrically isolated from said third plate and said fourth plate, and connecting said fifth plate through respective parasitic limiting resistors to the gate elements of said power transistors.

10. A method according to claim 9 further comprising the step of connecting said fifth plate to ground.

11. A method according to claim 1 further comprising the step of connecting a plurality of capacitors between said first plate and said second plate such that the connections provide both electrical continuity and mechanical support for said capacitors.

12. A method according to claim 1 further comprising the step of mounting a plurality of driver transistors to said second plate.

13. A method according to claim 12 wherein said driver transistors ar connected in parallel.

14. A method according to claim 13 wherein said driver transistors are field-effect transistors.

15. A method according to claim 14 further comprising the step of connecting said driver transistors in a common source configuration, the source element of each of said power transistors being connected through a respective fuse resistor to said second plate and therefore effectively connected to ground.

16. A method according to claim 15 further comprising the step of connecting the drain elements of said driver transistors to a first end of the primary winding of said coupling transformer.

17. A method according to claim 16 further comprising the step of connecting the second end of the primary winding of said coupling transformer to the source of positive voltage.

18. A method according to claim 17 further comprising the step of connecting the output end of the feedback winding of said coupling transformer through respective resistors to the gate elements of said driver transistors, said gate elements being connected through other respective resistors to an input signal source.

19. A method according to claim 1 further comprising the step of connecting a plurality of modules to a single microwave tube modulator output transformer to increase the electrical energy available for the operation thereof.

20. A microwave tube modulator having an effective disposition of components, particularly power transistors, in the primary circuit of a microwave tube modulator output transformer to minimize electrical resistance and inductance in the primary circuit, the modulator comprising:
   a first plate connected to a first end of the microwave tube modulator output transformer primary and to a source of positive voltage;
   a second plate disposed in spaced apposition to said first plate and connected to ground;
   a third plate disposed in progressively spaced apposition to said first plate and said second plate, said third plate being connected to a second end of the output transformer primary; and
   a plurality of primary circuit power transistors mounted on said third plate at minimum practical distances from the second end of the output transformer primary such that the common element of each of said power transistors is connected to said third plate and therefore effectively connected to the second end of the output transformer primary, said first plate providing a low-resistance path for current flowing between the output transformer primary and the source of positive voltage and said third plate providing a low-resistance path for current flowing between the respective drain elements of said power transistors and the output transformer primary, said first and said third plates also minimizing inductance in the output transformer primary circuit.

21. A modulator according to claim 20 wherein said power transistors are connected in parallel.

22. A modulator according to claim 21 wherein said power transistors are field-effect transistors.

23. A modulator according to claim 22 wherein said power transistors are connected in a common gate configuration to minimize the effects of drain-to-gate capacitance and thereby increase the switching speed of said transistors, the gate element of each of said power transistors being connected to said third plate and therefore effectively connected to the second end of the output transformer primary.

24. A modulator according to claim 20 further comprising a coupling transformer mounted to said second plate, said coupling transformer having a primary, a feedback and a secondary winding, said feedback winding having a common end and an output end, the common end being connected to ground, said secondary winding having a common end and an output end, the common end being connected to ground.

25. A modulator according to claim 24 wherein said coupling transformer is mounted central to said second plate and between said second plate and said third plate.

26. A modulator according to claim 20 further comprising a fourth plate disposed in spaced apposition to and electrically isolated from said third plate, said fourth plate being connected through respective fuse resistors to the source element of each of said power transistors.

27. A modulator according to claim 26 wherein said fourth plate is connected to the output end of the secondary winding of said coupling transformer.

28. A modulator according to claim 27 further comprising a fifth plate disposed in spaced apposition to said third plate and electrically isolated from said third plate and said fourth plate, said fifth plate being connected through respective parasitic limiting resistors to the gate elements of said power transistors.

29. A modulator according to claim 28 wherein said fifth plate is connected to ground.

30. A modulator according to claim 20 further comprising a plurality of capacitors connected between said first plate and said second plate such that the connections provide both electrical continuity and mechanical support for said capacitors.

31. A modulator according to claim 20 further comprising a plurality of driver transistors mounted to said second plate.

32. A modulator according to claim 31 wherein said driver transistors are connected in parallel.

33. A modulator according to claim 32 wherein said driver transistors are field-effect transistors.

34. A modulator according to claim 33 wherein said driver transistors are connected in a common source configuration, the source element of each of said power transistors being connected through a respective fuse resistor to said second plate and therefore effectively connected to ground.

35. A modulator according to claim 34 wherein the drain elements of said driver transistors are connected to a first end of the primary winding of said coupling transformer.

36. A modulator according to claim 35 wherein the second end of the primary winding of said coupling transformer is connected to the source of positive voltage.

37. A modulator according to claim 36 wherein the output end of the feedback winding of said coupling transformer is connected through respective resistors to the gate elements of said driver transistors, said gate elements being connected through other respective resistors to an input signal source.

38. A modulator according to claim 20 wherein a plurality of modules are connected to a single microwave tube modulator output transformer to increase the electrical energy available for the operation thereof.

* * * * *

UNITED STATES PATENT AND TRADEMARK OFFICE
CERTIFICATE OF CORRECTION

PATENT NO. : 4,841,258

DATED : June 20, 1989

INVENTOR(S) : Ehrenhalt et al.

It is certified that error appears in the above-identified patent and that said Letters Patent is hereby corrected as shown below:

Column 2, line 55 "therefor" should be --therefore--;

Column 4, line 50, after "Claim" insert --1--;

Column 5, line 20, after "transistors" "ar" should be --are--.

Signed and Sealed this

Twelfth Day of June, 1990

Attest:

HARRY F. MANBECK, JR.

Attesting Officer     Commissioner of Patents and Trademarks